United States Patent
Galbi et al.

(10) Patent No.: US 11,699,471 B2
(45) Date of Patent: Jul. 11, 2023

(54) SYNCHRONOUS DYNAMIC RANDOM ACCESS MEMORY (SDRAM) DUAL IN-LINE MEMORY MODULE (DIMM) HAVING INCREASED PER DATA PIN BANDWIDTH

(71) Applicant: Intel Corporation, Santa Clara, CA (US)

(72) Inventors: Duane E. Galbi, Cambridge, MA (US); Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 17/030,107

(22) Filed: Sep. 23, 2020

(65) Prior Publication Data

US 2021/0005234 A1    Jan. 7, 2021

Related U.S. Application Data

(60) Provisional application No. 62/906,045, filed on Sep. 25, 2019.

(51) Int. Cl.
| | | |
|---|---|---|
| G11C 7/22 | (2006.01) | |
| G11C 7/10 | (2006.01) | |
| G06F 13/16 | (2006.01) | |
| G06F 13/28 | (2006.01) | |
| G11C 8/18 | (2006.01) | |

(52) U.S. Cl.
CPC .......... *G11C 7/222* (2013.01); *G06F 13/1684* (2013.01); *G06F 13/287* (2013.01); *G11C 7/1012* (2013.01); *G11C 8/18* (2013.01)

(58) Field of Classification Search
CPC ......... G11C 7/222; G11C 7/1012; G11C 8/18; G11C 5/04; G11C 7/1018; G11C 11/4076; G11C 11/4093; G06F 13/1684; G06F 13/287
See application file for complete search history.

(56) References Cited

U.S. PATENT DOCUMENTS

| | | | |
|---|---|---|---|
| 6,446,158 B1 | 9/2002 | Karabatsos | |
| 6,854,042 B1 | 2/2005 | Karabatsos | |
| 7,209,397 B2 | 4/2007 | Ware et al. | |
| 7,650,457 B2 | 1/2010 | Ruckerbauer | |
| 7,861,014 B2 | 12/2010 | Gower et al. | |

(Continued)

*Primary Examiner* — Ajay Ojha
(74) *Attorney, Agent, or Firm* — Compass IP Law PC

(57) ABSTRACT

An apparatus is described. The apparatus includes logic circuitry to multiplex on a data bus a first data burst, a second data burst, a third data burst and a fourth data burst having different respective base target addresses that respectively target a first memory rank, a second memory rank, a third memory rank and a fourth memory rank. A first data transfer for the first data burst occurs on a first edge of a first pulse of a data strobe signal for the data bus and a second data transfer for the second data burst occurs on a second edge of the first pulse of the data strobe signal. A third data transfer for the third data burst occurs on a first edge of a second pulse of the data strobe signal for the data bus and a fourth data transfer for the fourth data burst occurs on a second edge of the second pulse. The second pulse immediately follows the first pulse on the data strobe signal. The first memory rank, the second memory rank, the third memory rank and the fourth memory rank are on a same memory module.

20 Claims, 16 Drawing Sheets

(56) References Cited

U.S. PATENT DOCUMENTS

| | | |
|---|---|---|
| 8,806,116 B2 | 8/2014 | Karamcheti et al. |
| 9,368,174 B2 | 6/2016 | Nishio |
| 9,811,263 B1 | 11/2017 | Teh |
| 2006/0136618 A1 | 6/2006 | Gower et al. |
| 2006/0262586 A1 | 11/2006 | Solomon et al. |
| 2007/0162715 A1 | 7/2007 | Tagawa |
| 2009/0161475 A1 | 6/2009 | Kim et al. |
| 2009/0254689 A1 | 10/2009 | Karamcheti et al. |
| 2012/0206165 A1 | 8/2012 | Ferolito et al. |
| 2014/0032984 A1 | 1/2014 | Lee et al. |
| 2014/0192583 A1 | 7/2014 | Rajan et al. |
| 2015/0149735 A1 | 5/2015 | Nale et al. |
| 2015/0302904 A1 | 10/2015 | Yoon et al. |
| 2015/0331817 A1 | 11/2015 | Han et al. |
| 2016/0110102 A1 | 4/2016 | Lee |
| 2016/0147678 A1 | 5/2016 | Nale |
| 2016/0291894 A1 | 10/2016 | Yeung et al. |
| 2016/0314085 A1 | 10/2016 | Ware et al. |
| 2016/0350002 A1 | 12/2016 | Vergis et al. |
| 2017/0092379 A1 | 3/2017 | Kim et al. |
| 2017/0160928 A1 | 6/2017 | Jaffari et al. |
| 2017/0168746 A1 | 6/2017 | Kwon et al. |
| 2017/0177496 A1 | 6/2017 | Han et al. |
| 2017/0249991 A1 | 8/2017 | Han et al. |
| 2017/0315914 A1 | 11/2017 | Muralimanohar et al. |
| 2018/0225235 A1 | 8/2018 | Lee |
| 2018/0292991 A1 | 10/2018 | Walker |
| 2019/0042095 A1 | 2/2019 | Vergis et al. |
| 2019/0042162 A1 | 2/2019 | McCall et al. |
| 2019/0042499 A1 | 2/2019 | McCall et al. |
| 2019/0042500 A1 | 2/2019 | Agarwal et al. |
| 2019/0129879 A1* | 5/2019 | Gonzalez .............. G11C 7/1066 |
| 2019/0156870 A1* | 5/2019 | Park .................... G11C 11/4093 |

\* cited by examiner

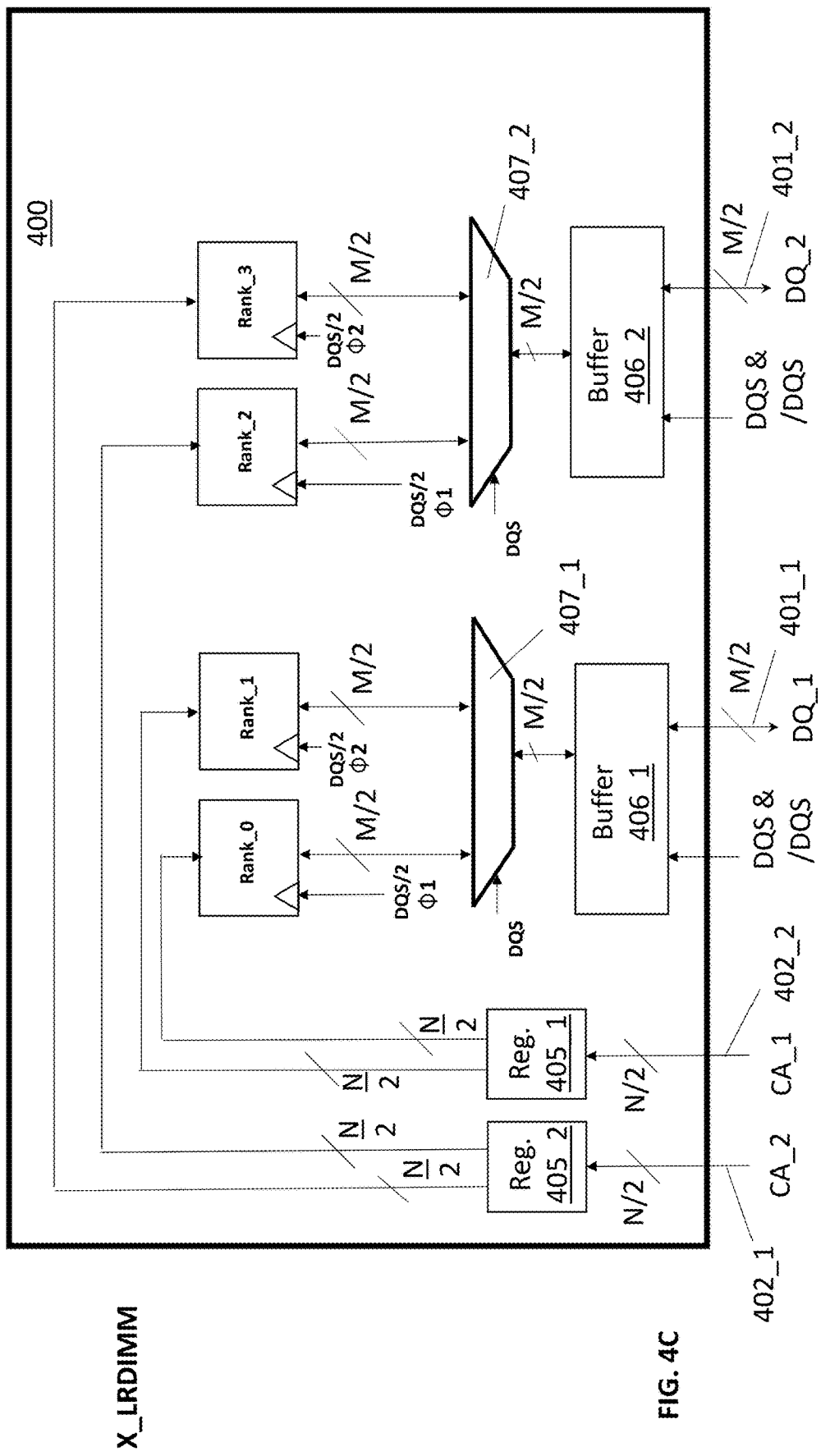

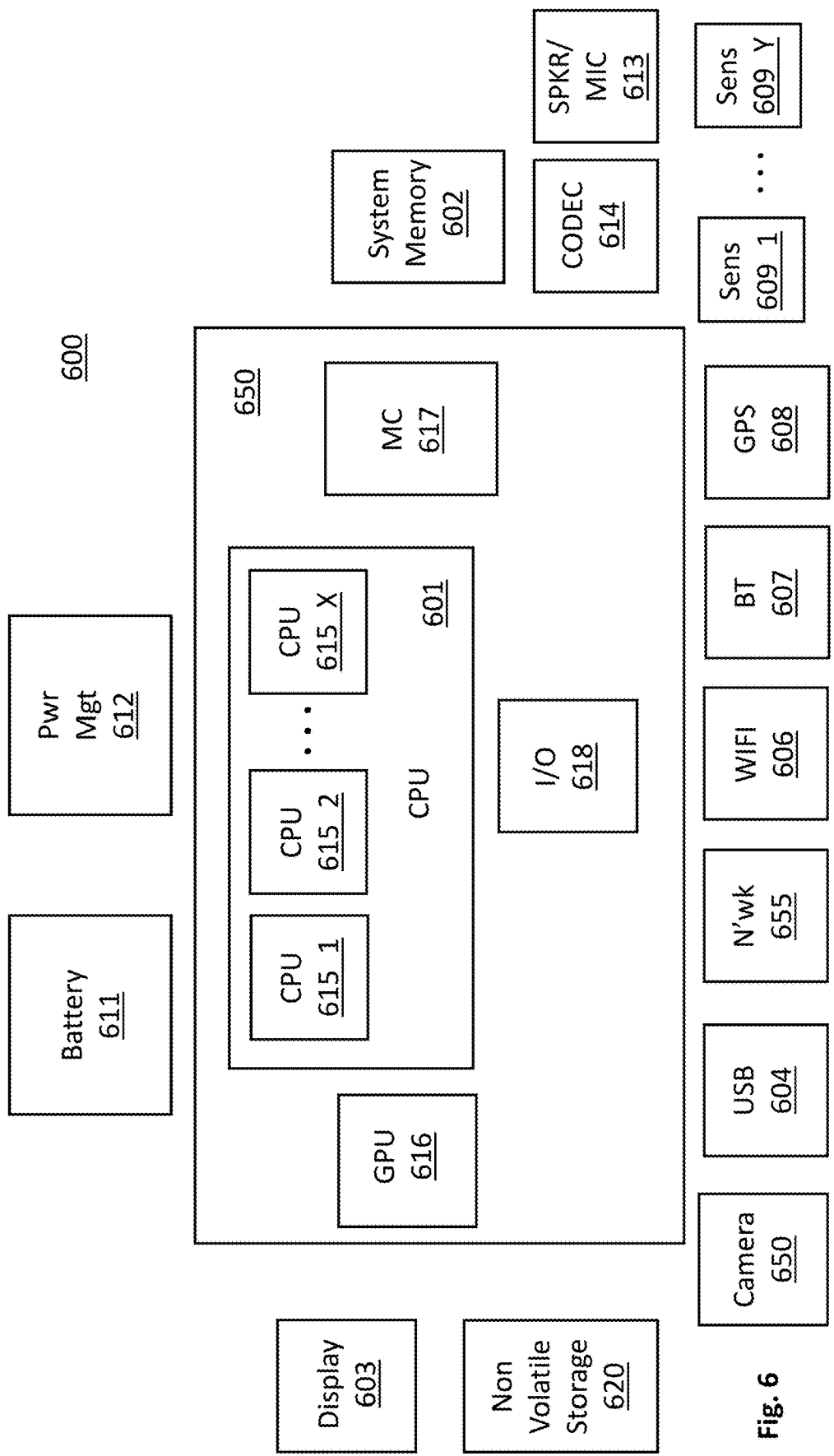

SYNCHRONOUS DYNAMIC RANDOM ACCESS MEMORY (SDRAM) DUAL IN-LINE MEMORY MODULE (DIMM) HAVING INCREASED PER DATA PIN BANDWIDTH

RELATED CASES

This application claims the benefit of U.S. Provisional Application No. 62/906,045, entitled, "DIMM HAVING INCREASED PER PIN BANDWIDTH", filed Sep. 25, 2019, which is incorporated by reference in its entirety.

FIELD OF INVENTION

The field of invention pertains generally to the electronic arts, and, more specifically, to a synchronous dynamic random access memory (SDRAM) dual in-line memory module (DIMM) having an increased per data pin bandwidth.

BACKGROUND

The performance of computing systems is highly dependent on the performance of their system memory. Generally, however, increasing memory channel capacity and memory speed can result in challenges concerning the power consumption of the memory channel implementation. As such, system designers are seeking ways to increase memory channel capacity and bandwidth while keeping power consumption in check.

FIGURES

Figure 1:
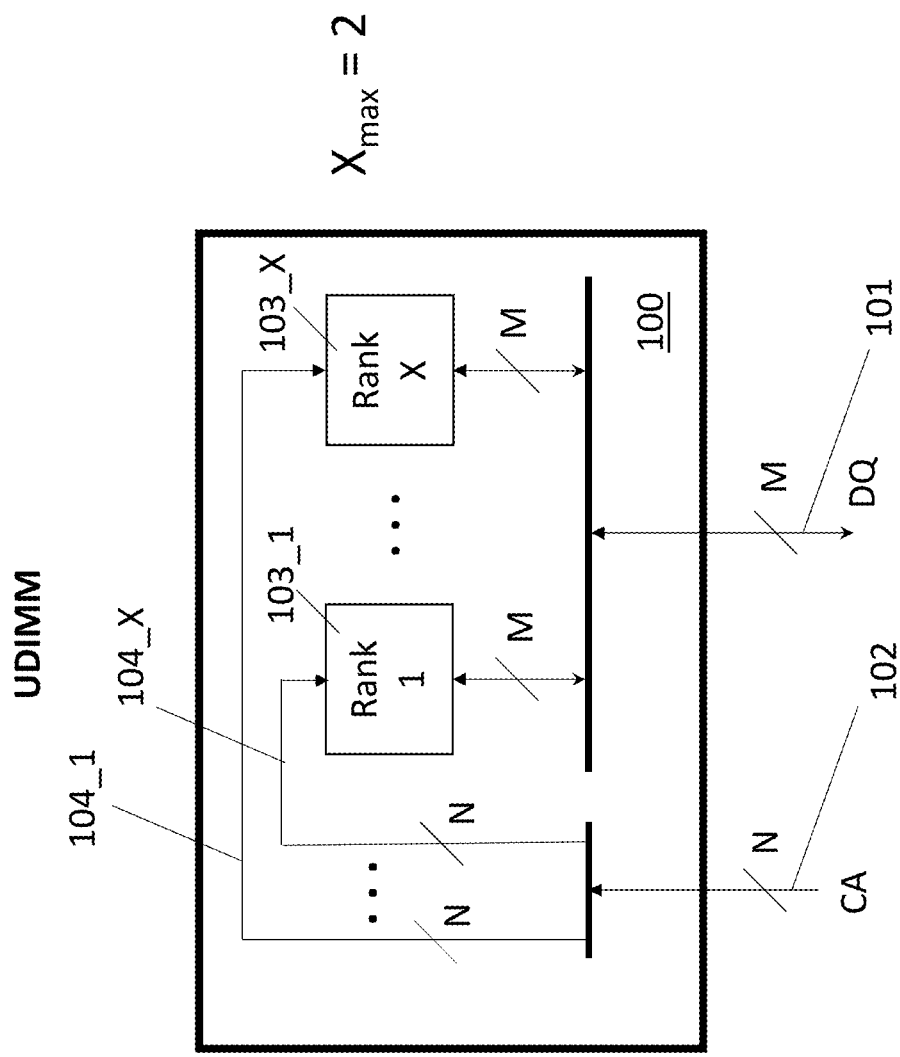
Figure 2:
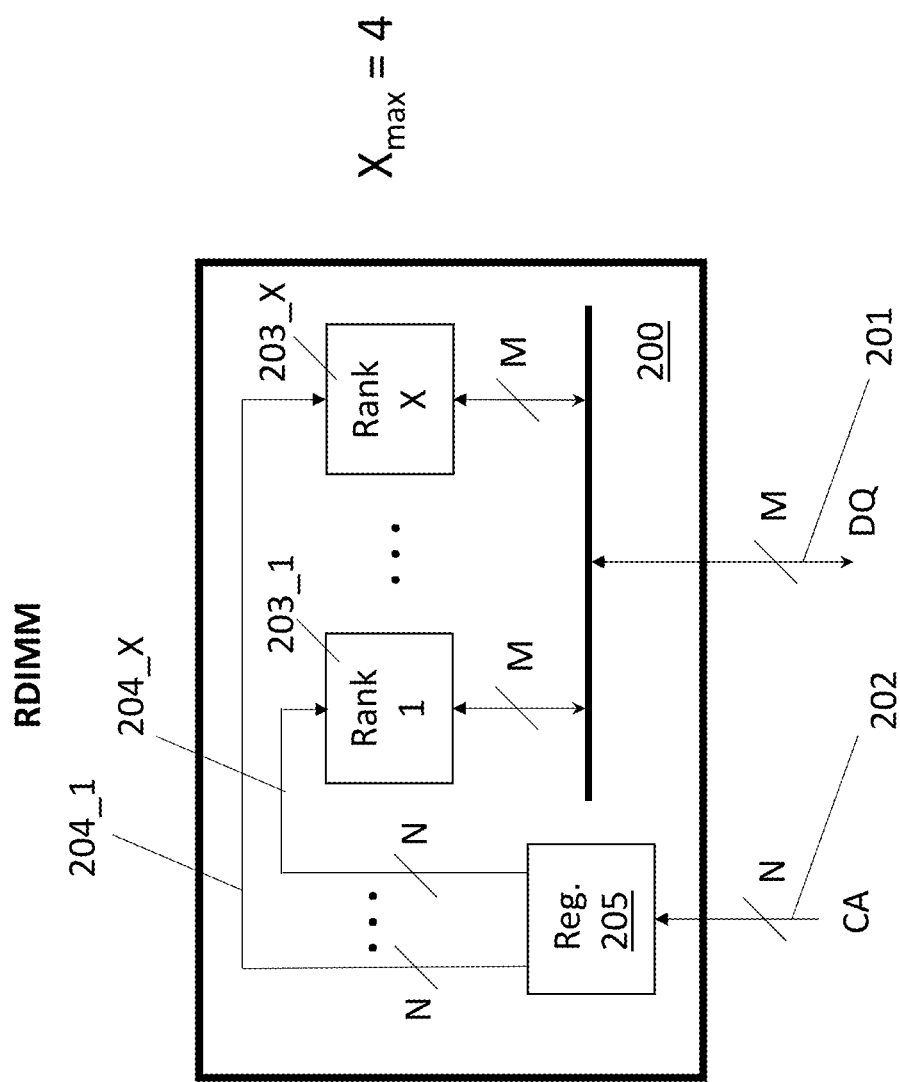
Figure 3A:
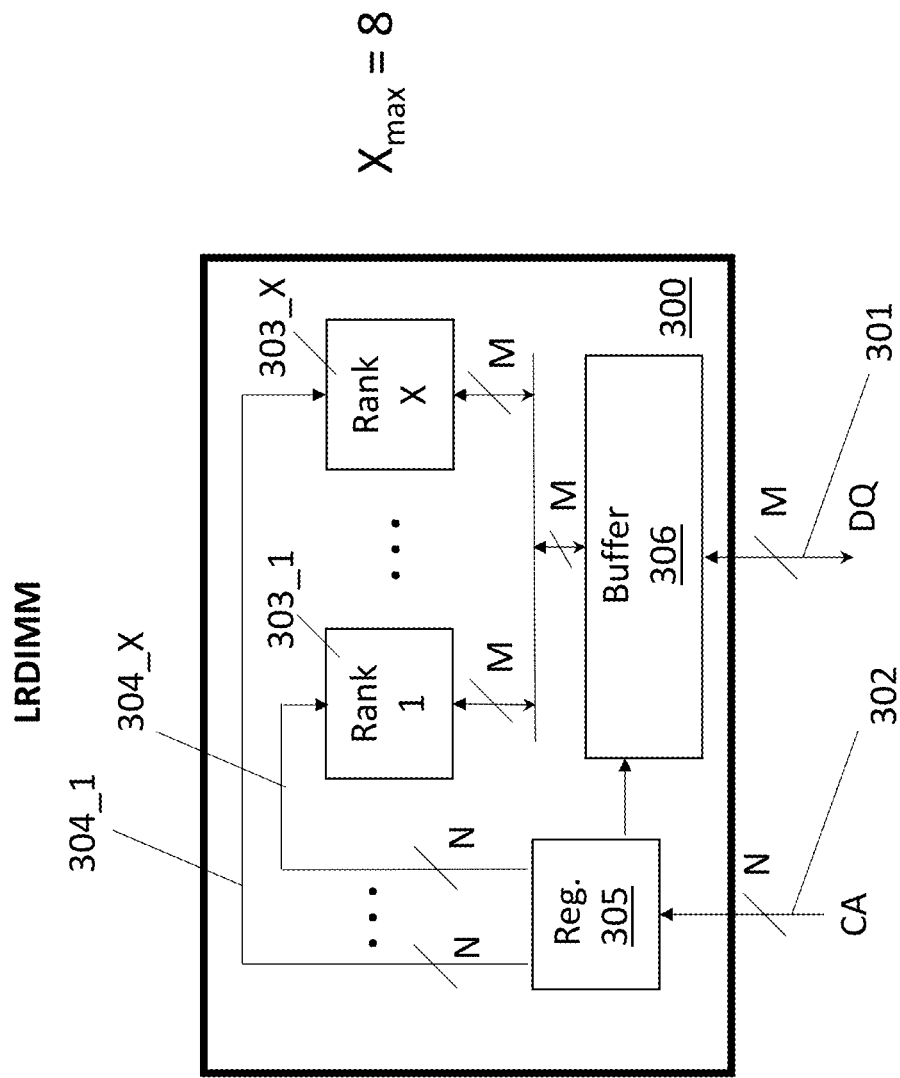
Figure 3B:
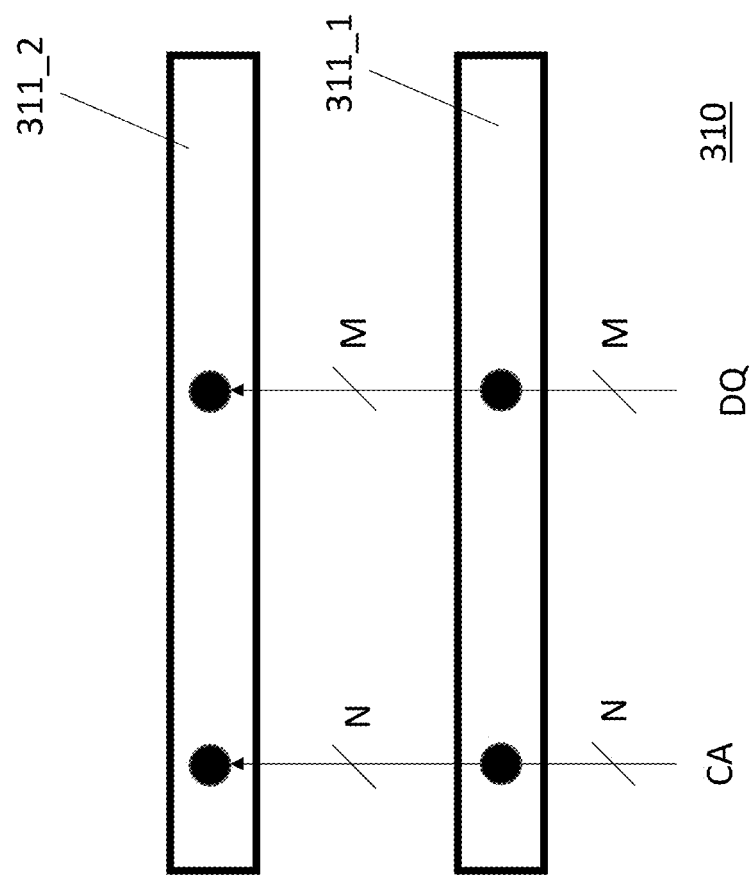
Figure 4A:
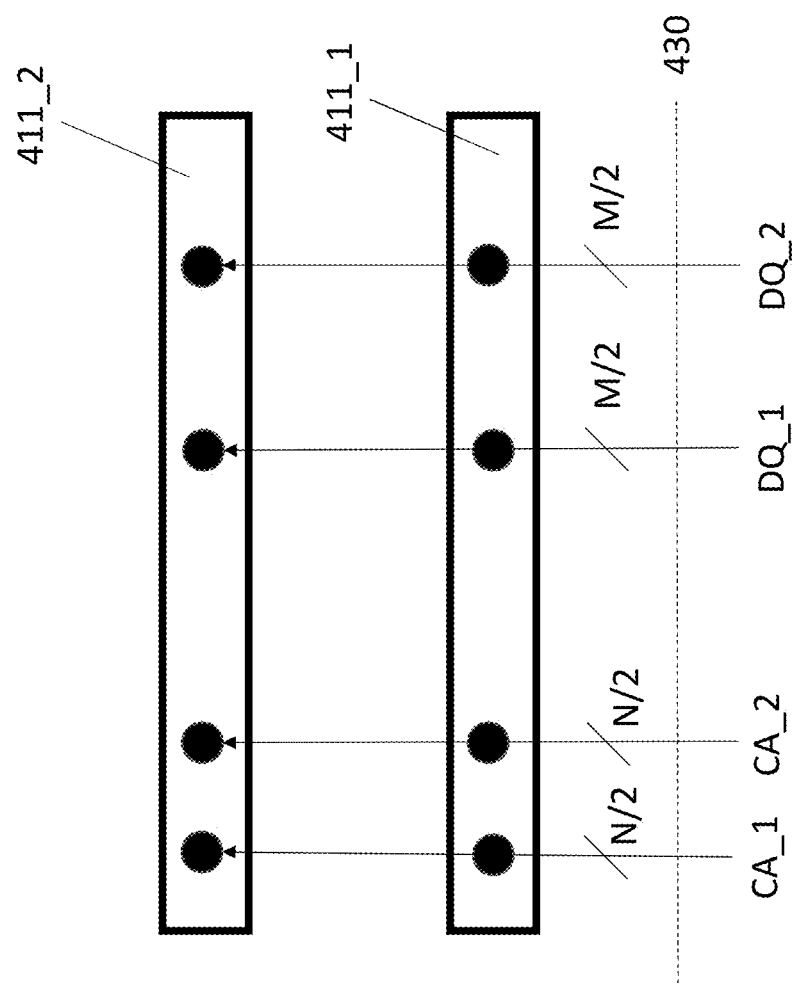
Figure 4B:
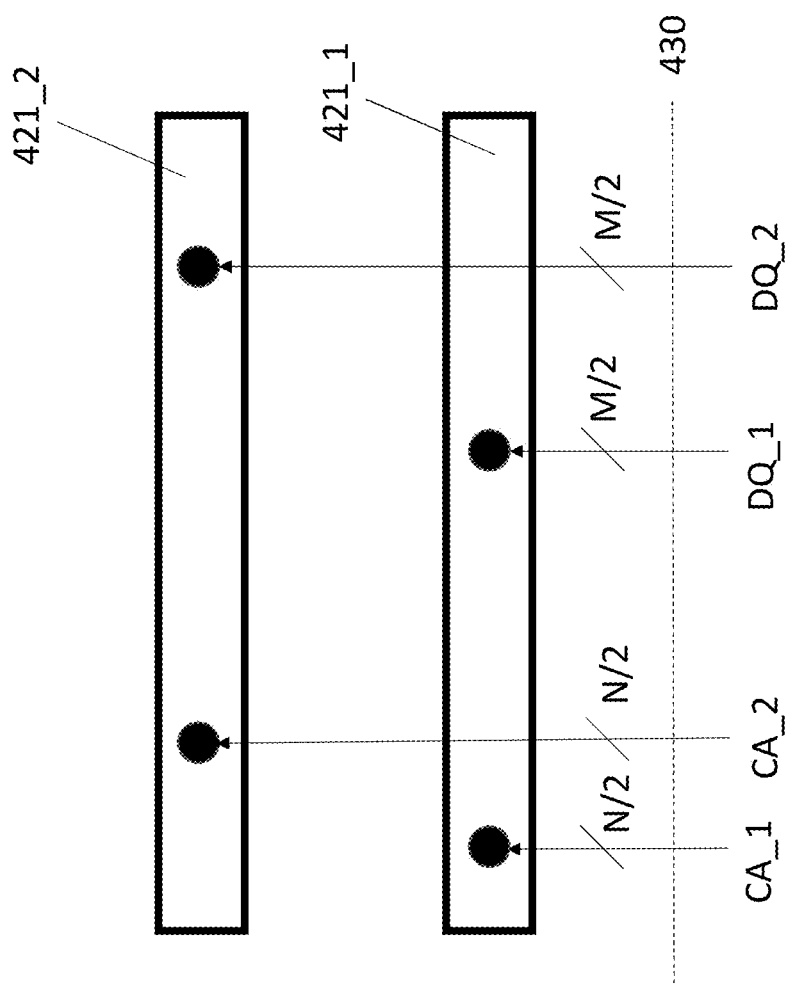
Figure 4D:
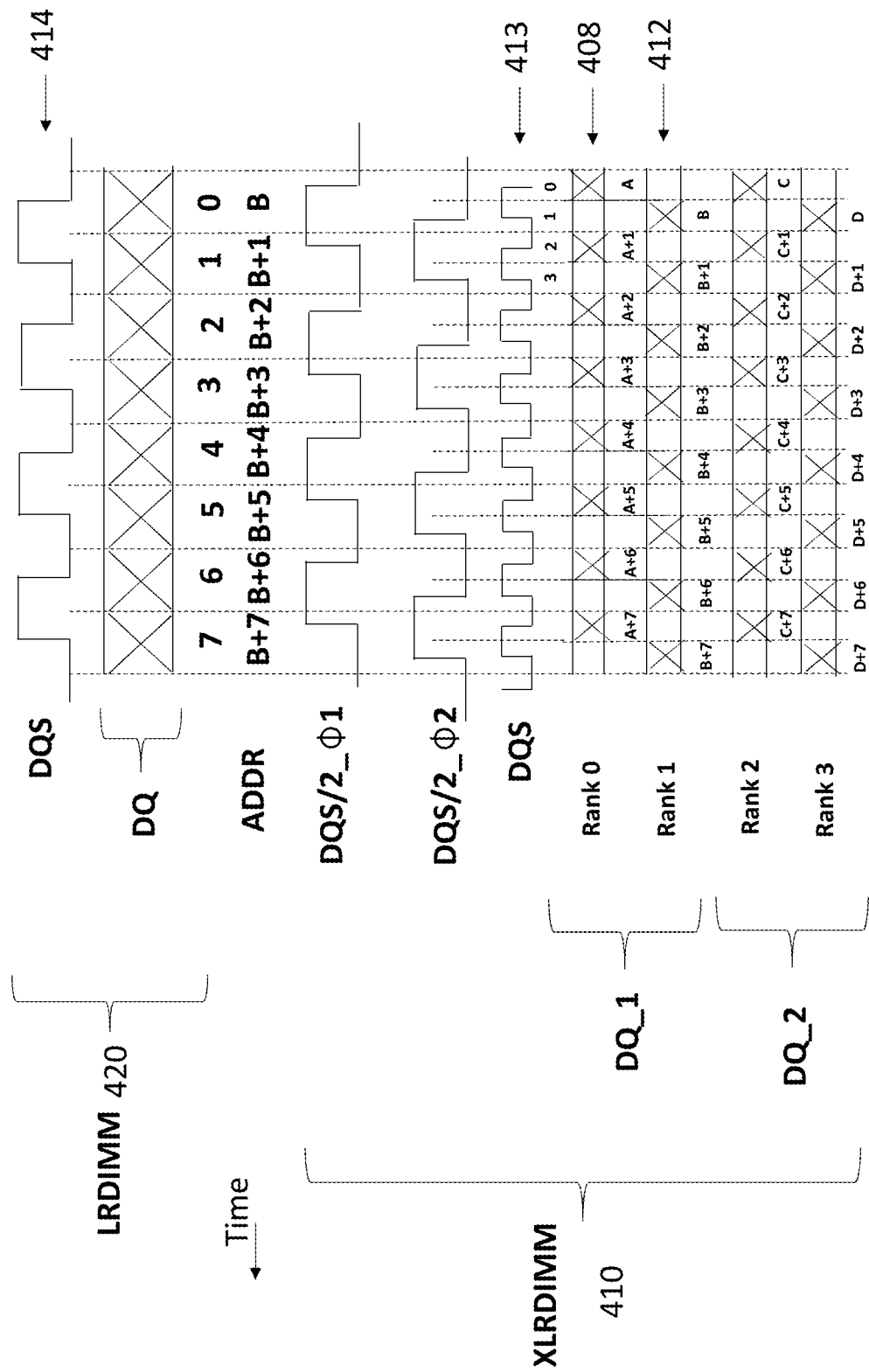
Figure 4E:
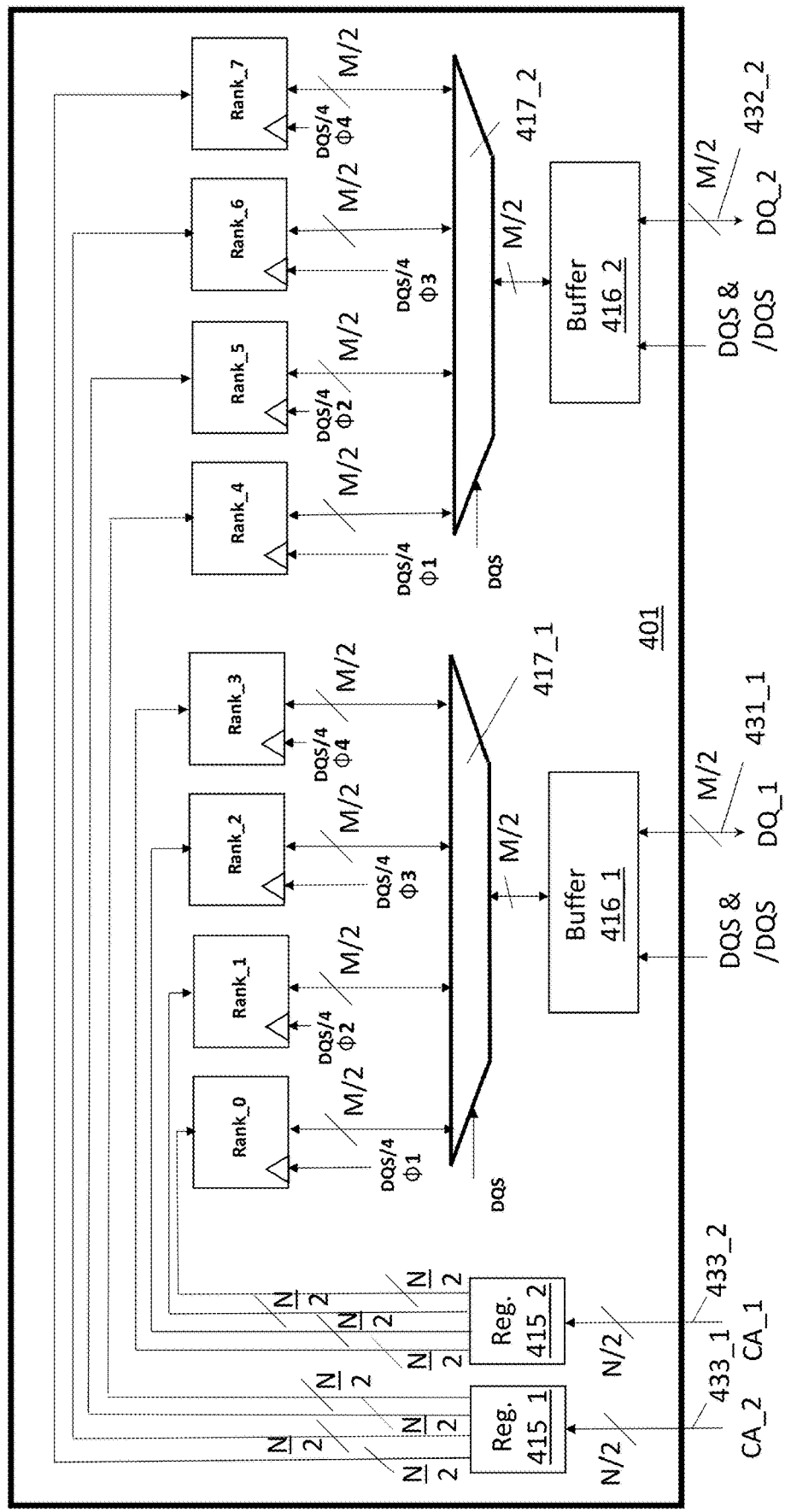
Figure 4F:
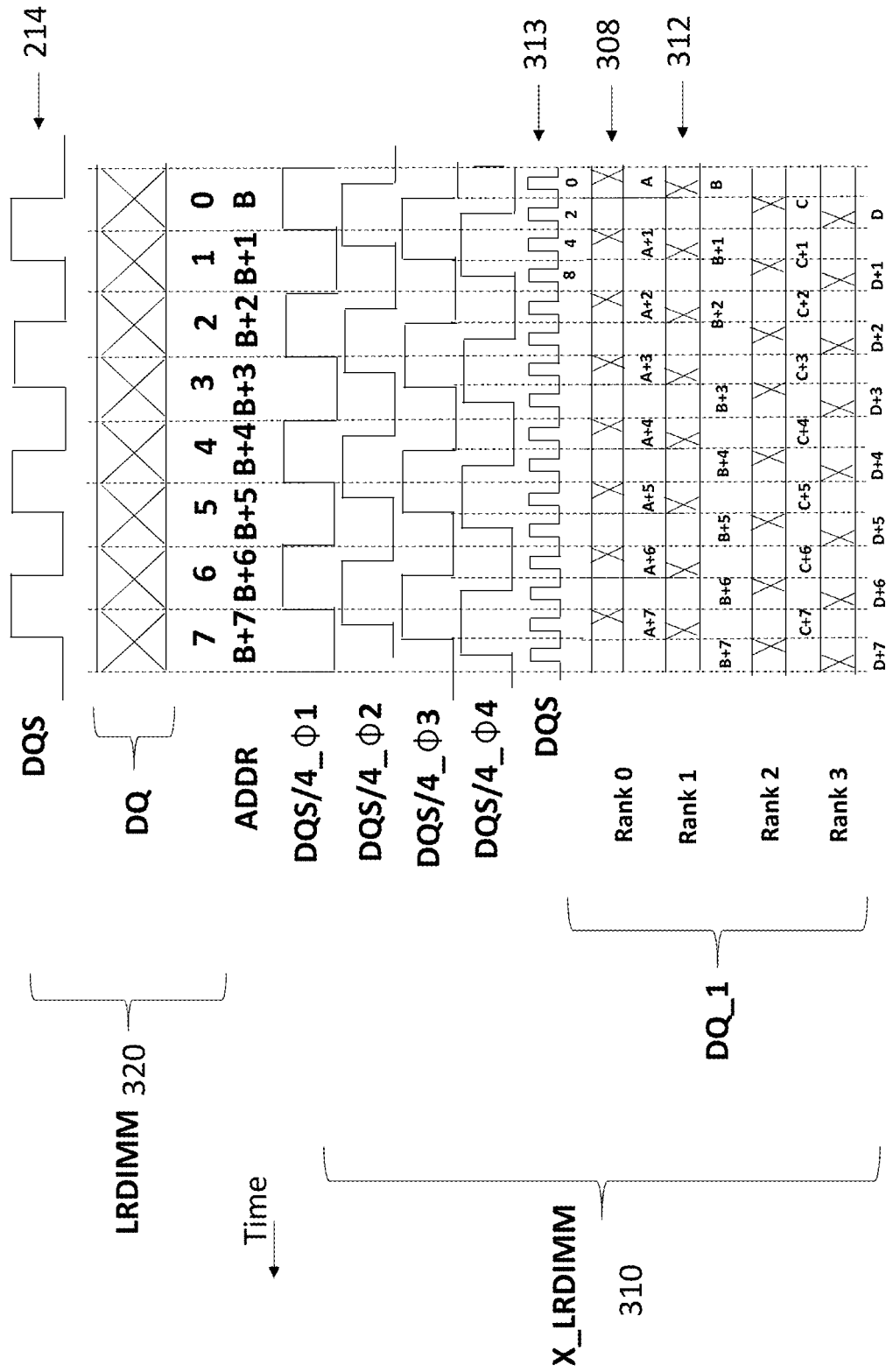
Figure 4G:
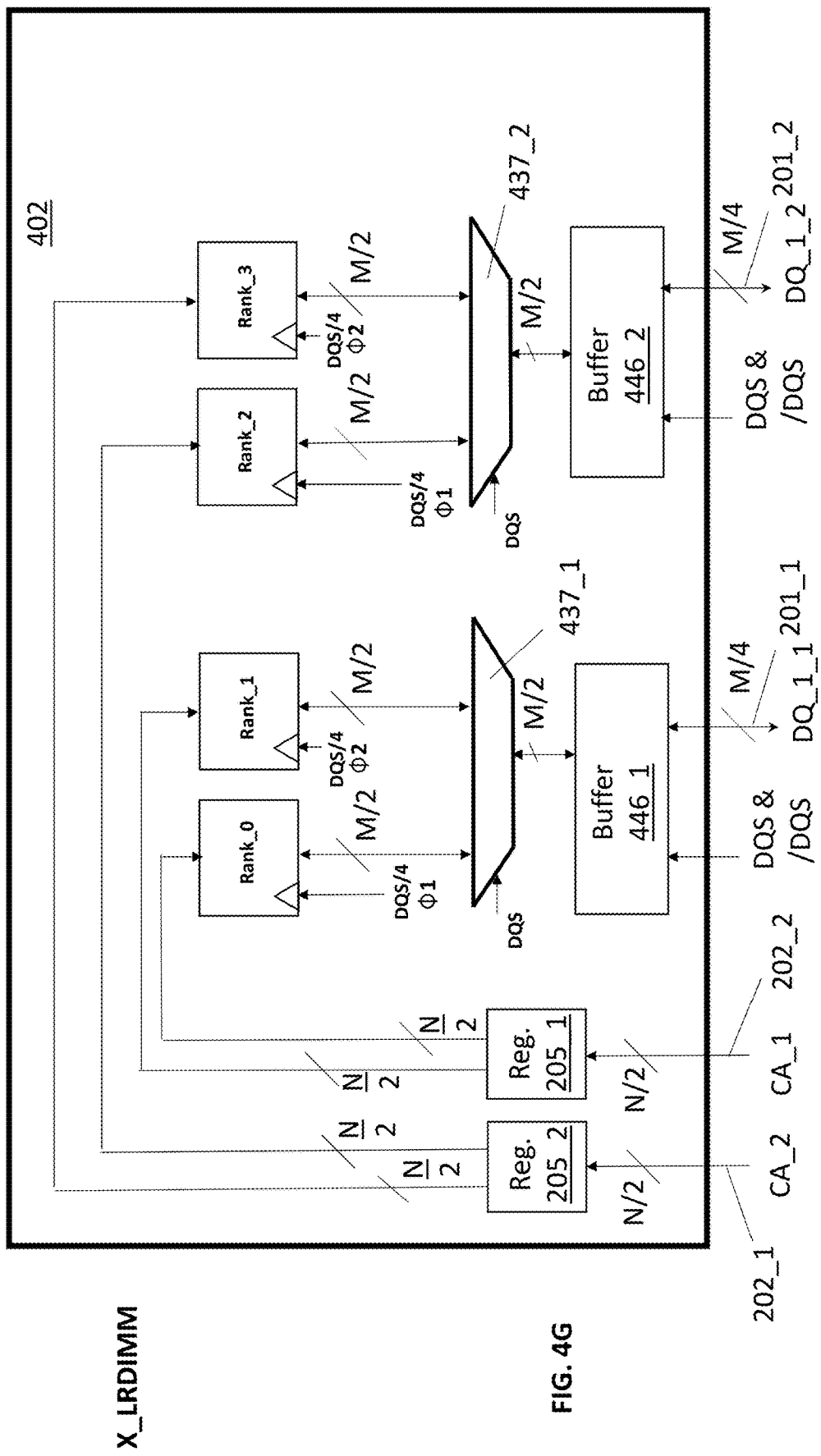
Figure 4H:
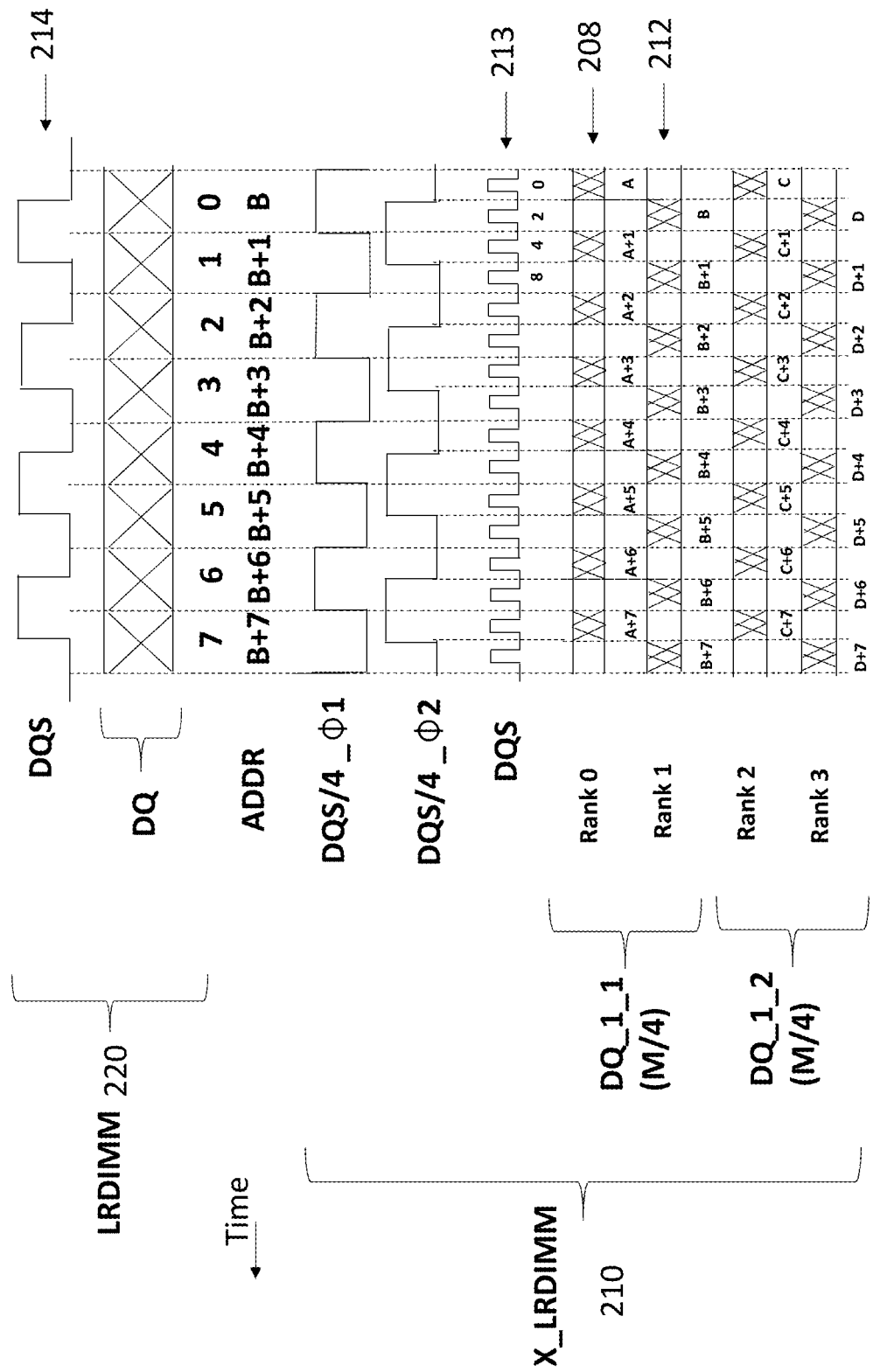
Figure 5A:
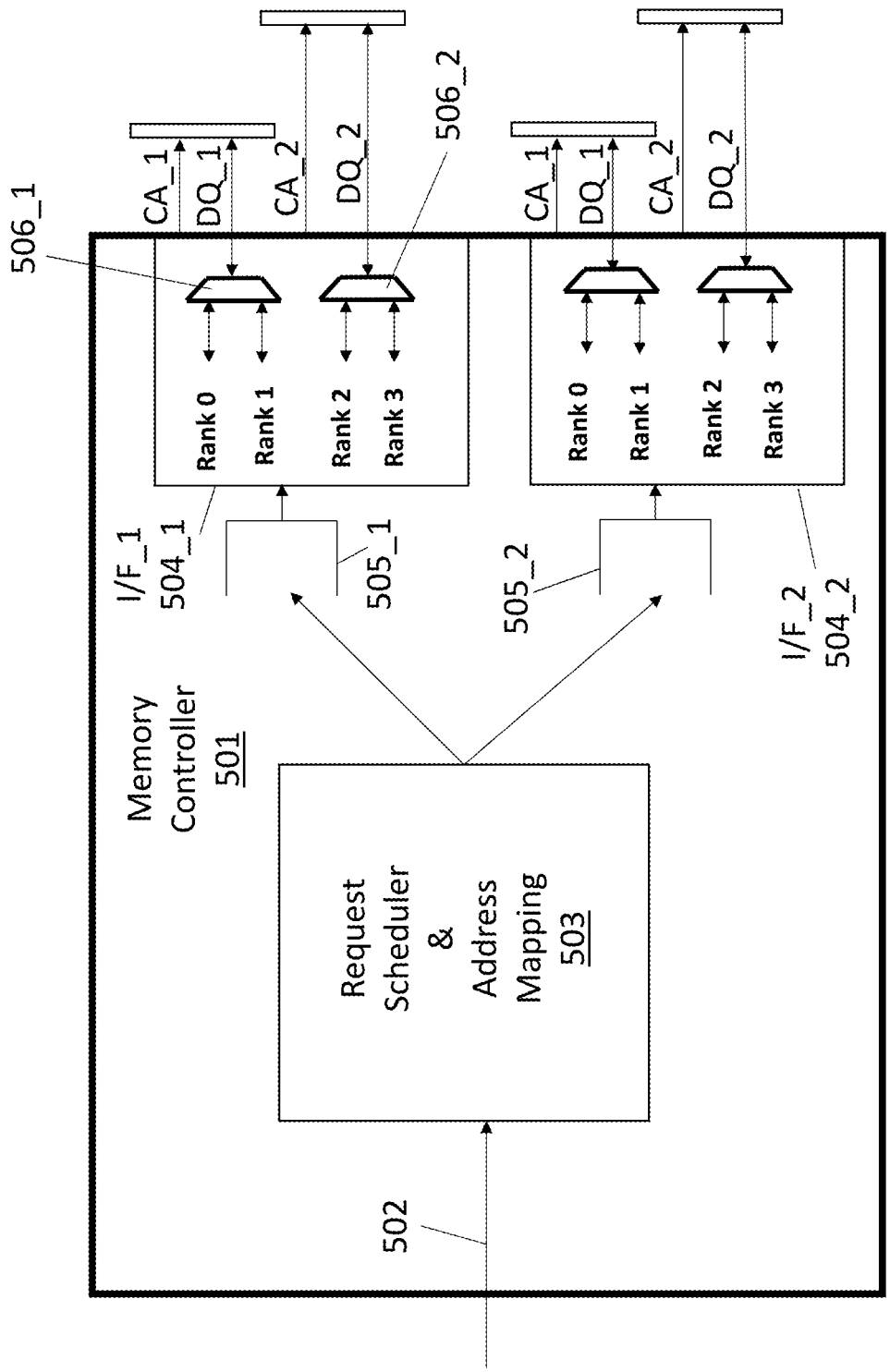
Figure 5B:
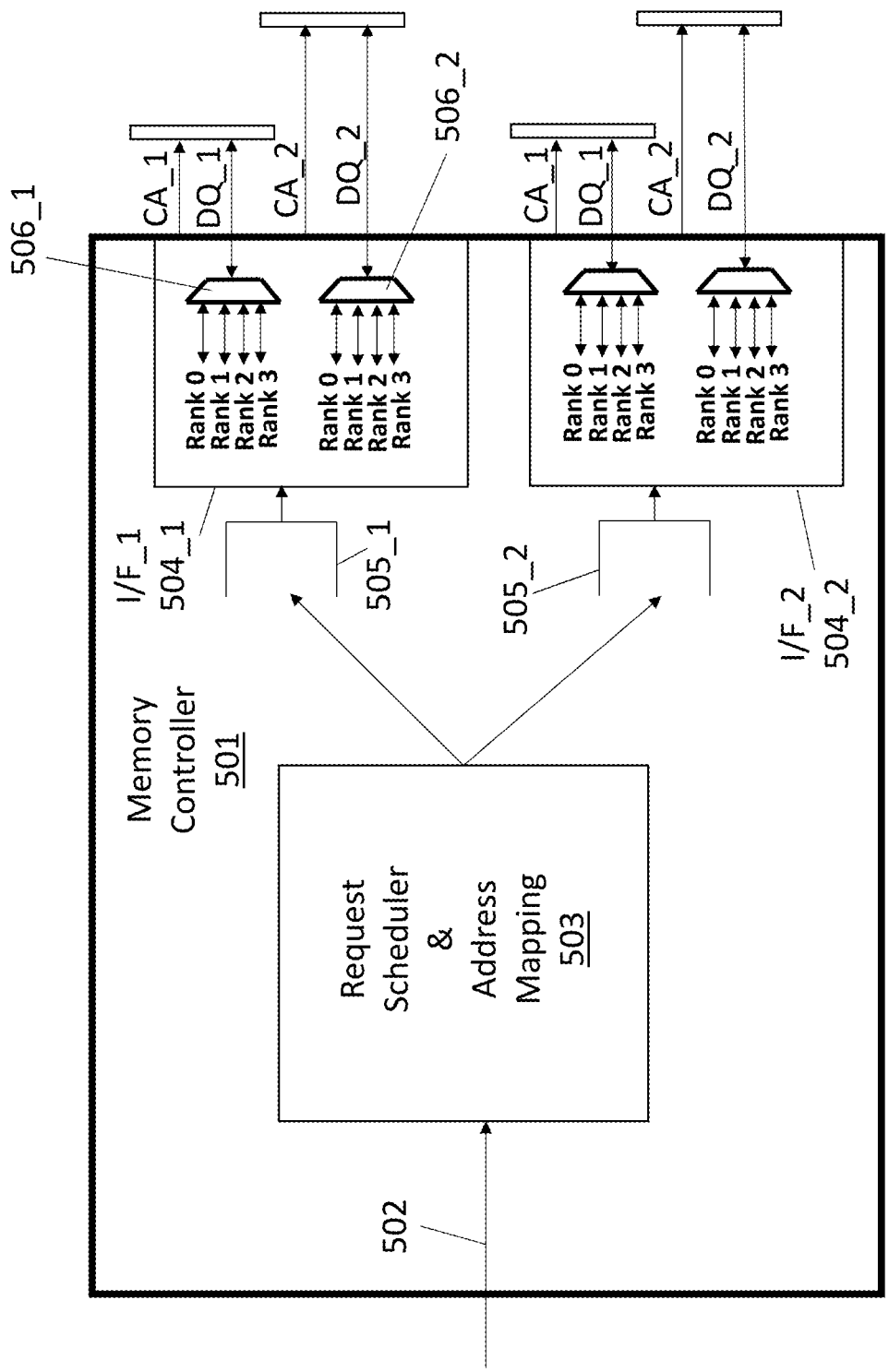
Figure 5C:
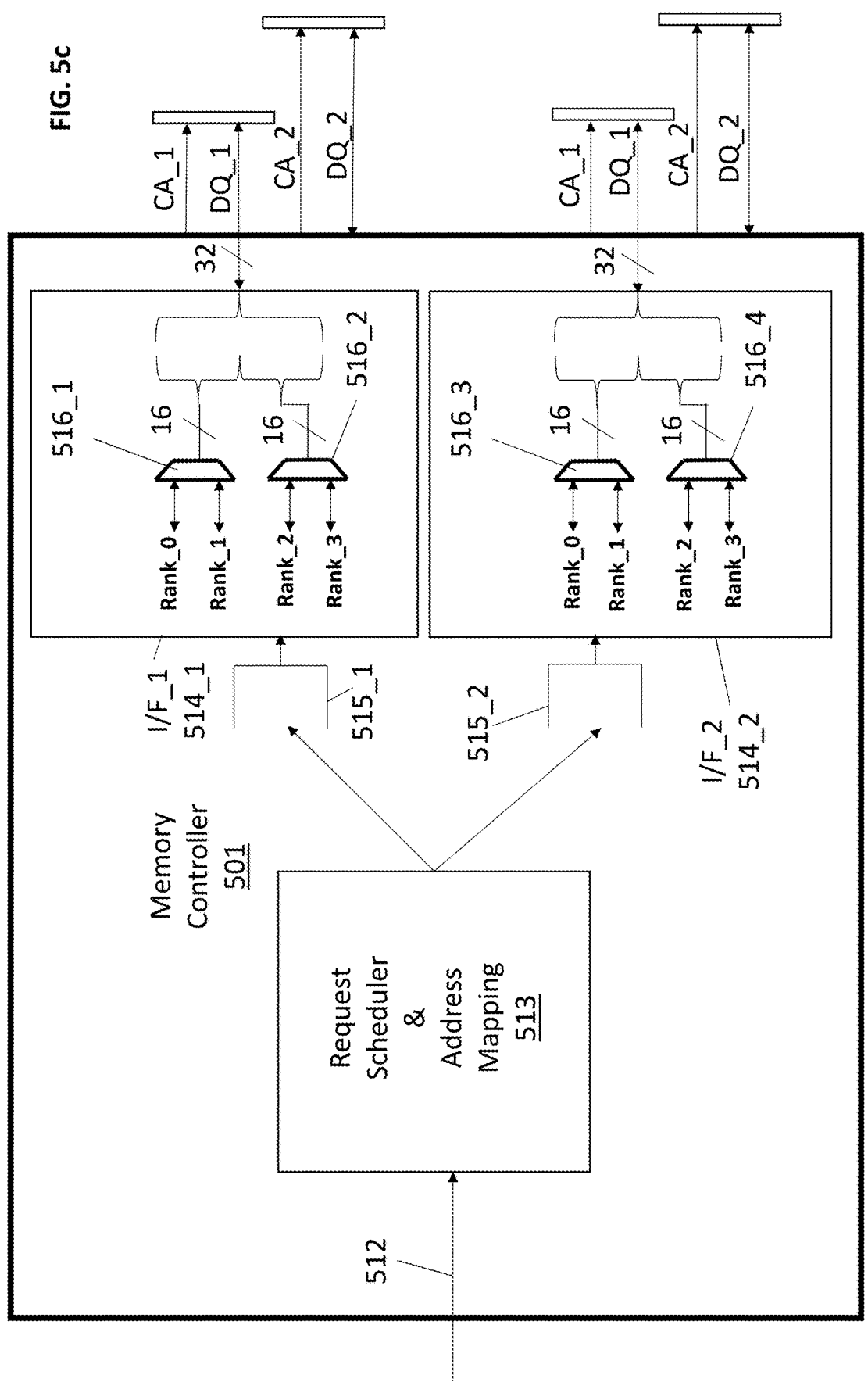

A better understanding of the present invention can be obtained from the following detailed description in conjunction with the following drawings, in which:

FIG. 1 shows a first prior art DIMM;
FIG. 2 shows a second prior art DIMM;
FIG. 3a shows a third prior art DIMM;
FIG. 3b shows a first layout for a memory channel that interfaces with DIMMs of FIG. 3;
FIG. 4a shows an emerging layout for a memory channel;
FIG. 4b shows an improved layout for a memory channel;
FIG. 4c shows an improved DIMM that is to interface with the improved layout of FIG. 4a and/or 4b;
FIG. 4d shows a timing diagram for the DIMM of FIG. 4c;
FIG. 4e shows another improved DIMM;
FIG. 4f shows a timing diagram for the DIMM of FIG. 4e;
FIG. 4g shows yet another improved DIMM;
FIG. 4h shows a timing diagram for the DIMM of FIG. 4g
FIG. 5a shows a memory controller to interface with the improved DIMM of FIG. 4c;
FIG. 5b shows a memory controller to interface with the improved DIMM of FIG. 4e;
FIG. 5c shows a memory controller to interface with the improved DIMM of FIG. 4g;
FIG. 6 shows a computing system.

DETAILED DESCRIPTION

As is known in the art, main memory (also referred to as "system memory") in high performance computing systems, such as high performance servers, are often implemented with synchronous dynamic random access memory (SDRAM) dual in-line memory modules (DIMMs) that plug into a memory channel. Here, multiple memory channels emanate from a main memory controller and one or more SDRAM DIMMs are plugged into each memory channel. Each SDRAM DIMM (hereinafter, simply "DIMM") includes a number of memory chips that define the DIMM's memory storage capacity. The combined memory capacity of the DIMMs that are plugged into the memory controller's memory channels corresponds to the system memory capacity of the system.

Over time the design and structure of DIMMs has changed to meet the ever increasing need of both memory capacity and memory channel bandwidth. FIG. 1 shows a traditional DIMM approach. As observed in FIG. 1, a single "unbuffered" DIMM (UDIMM) 100 has its memory chips directly coupled to the wires of the memory channel bus 101, 102. The UDIMM 100 includes a number of memory chips sufficient to form a data width of at least one rank 103. A rank corresponds to the width of the data bus which generally corresponds to the number of data signals and the number of error correction code (ECC) signals on the memory channel.

As such, the total number of memory chips used on a DIMM is a function of the rank size and the bit width of the memory chips. For example, for a rank having 64 bits of data and 8 bits of ECC, the DIMM can include eighteen "X4" (four bit width) memory chips (e.g., 16 chips×4 bits/chip=64 bits of data plus 2 chips×4 bits/chip to implement 8 bits of ECC), or, nine "X8" (eight bit width) memory chips (e.g., 8 chips×8 bits/chip=64 bits of data plus 1 chip×8 bits/chip to implement 8 bits of ECC).

For simplicity, when referring to FIG. 1 and the ensuing figures, the ECC bits may be ignored and the observed rank width M simply corresponds to the number of data bits on the memory bus. That is, e.g., for a data bus having 64 data bits, the rank=M=64.

UDIMMs traditionally only have storage capacity for two separate ranks of memory chips, where, one side of the DIMM has the memory chips for a first rank and the other side of the DIMM has the memory chips for a second rank. Here, a memory chip has a certain amount of storage space which correlates with the total number of different addresses that can be provided to the memory chip. A memory structure composed of the appropriate number of memory chips to interface with the data bus width (eighteen X4 memory chips or nine X8 memory chips in the aforementioned example) corresponds to a rank of memory chips. A rank of memory chips can therefore separately store a number of transfers from the data bus consistently with its address space. For example, if a rank of memory chips is implemented with memory chips that support 256 million (M) different addresses, the rank of memory chips can store the information of 256M different bus transfers.

Notably, the memory chips used to implement both ranks of memory chips are coupled to the memory channel 101, 102 in a multi-drop fashion. As such, the UDIMM 100 can present as much as two memory chips of load to each wire of the memory channel data bus 101 (one memory chip load for each rank of memory chips).

Similarly, the command and address signals for both ranks of memory chips are coupled to the memory channel's command address (CA) bus 102 in multi-drop form. The control signals that are carried on the CA bus 102 include, to name a few, a row address strobe signal (RAS), column address strobe signal (CAS), a write enable (WE) signal and a plurality of address (ADDR) signals. Some of the signals on the CA bus 102 typically have stringent timing margins. As such, if more than one DIMM is plugged into a memory channel, the loading that is presented on the CA bus 102 can sufficiently disturb the quality of the CA signals and limit the memory channel's performance.

FIG. 2 shows a later generation DIMM, referred to as a registered DIMM 200 (RDIMM), that includes register and redrive circuitry 205 to address the aforementioned limit on memory channel performance presented by loading of the CA bus 202. Here, the register and redrive circuitry 205 acts as a single load per DIMM on each CA bus 202 wire as opposed to one load per rank of memory chips (as with the UDIMM). As such, whereas a nominal dual rank UDIMM will present one load on each wire of the memory channel's CA bus 202 for memory chip on the UDIMM (because each memory chip on the UDIMM is wired to the CA bus 202), by contrast, a dual rank RDIMM with an identical set of memory chips, etc. will present only one chip load on each of the memory channel's CA bus 202 wires.

In operation, the register and redrive circuitry 205 latches and/or redrives the CA signals from the memory channel's CA bus 202 to the memory chips of the particular rank of memory chips on the DIMM that the CA signals are specifically being sent to. Here, for each memory access (read or write access with corresponding address) that is issued on the memory channel, the corresponding set of CA signals include chip select signals (CS) and/or other signals that specifically identify not only a particular DIMM on the channel but also a particular rank on the identified DIMM that is targeted by the access. The register and redrive circuitry 205 therefore includes logic circuitry that monitors these signals and recognizes when its corresponding DIMM is being accessed. When the logic circuitry recognizes that its DIMM is being targeted, the logic further resolves the CA signals to identify a particular rank of memory chips on the DIMM that is being targeted by the access. The register and redrive circuitry then effectively routes the CA signals that are on the memory channel to the memory chips of the specific targeted rank of memory chips on the DIMM 200.

A problem with the RDIMM 200, however, is that the signal wires for the memory channel's data bus 201 (DQ) are also coupled to the DIMM's ranks of memory chips 203_1 through 203_X in a multi-drop form. That is, for each rank of memory chips that is disposed on the RDIMM, the RDIMM will present one memory chip load on each DQ signal wire. Thus, similar to the UDIMM, the number of ranks of memory chips that can be disposed on an RDIMM is traditionally limited (e.g., to two ranks of memory chips) to keep the loading on the memory channel data bus 201 per RDIMM in check.

FIG. 3a shows an even later generation DIMM, referred to as a load reduced DIMM (LRDIMM) 300, in which both the CA bus wires 302 and the DQ bus wires 301 are presented with only a single load by the LRDIMM 300. Here, similar to the register and redrive circuitry of the RDIMM, the LRDIMM includes buffer circuitry 306 that stores and forwards data that is to be passed between the memory channel data bus 301 and the particular rank of memory chips 303 that is being targeted by an access. The register and redrive circuitry 305 activates whichever rank of memory chips is targeted by a particular access and the data associated with that access appears at the "back side" of the buffer circuitry 306.

With only a single point load for both the DQ and CA wires 301, 302 on the memory channel, the memory capacity of the LRDIMM 300 is free to expand its memory storage capacity beyond only two ranks of memory chips (e.g. four ranks on a single dual data rate 4 (DDR4) DIMM). With more ranks of memory chips per DIMM and/or a generalized insensitivity to the number of memory chips per DIMM (at least from a signal loading perspective), new memory chip packaging technologies that strive to pack more chips into a volume of space have received heightened attention is recent years. For example, stacked chip packaging solutions can be integrated on an LRDIMM to form, e.g., a 3 Dimensional Stacking (3DS) LRDIMM.

Even with memory capacity per DIMM being greatly expanded with the emergence of LRDIMMs, memory channel bandwidth remains limited with LRDIMMs because multiple LRDIMMs can plug into a same memory channel. That is, a multi-drop approach still exists on the memory channel in that more than one DIMM can couple to the CA and DQ wires of a same memory channel.

Here, FIG. 3b shows a high performance memory channel layout 310 in which two DIMM slots 311_1, 311_2 are coupled to a same memory channel. The particular layout of FIG. 3b is consistent with the Joint Electron Device Engineering Council (JEDEC) Double Date Rate 4 (DDR4) memory standard (e.g., as described in "DDR4 SDRAM Standard", Doc. No. JESD79-4, January 2020, published by JEDEC). As can be seen from the layout 310 of FIG. 3b, if a respective LRDIMM is plugged into each of the two slots 311_1, 311_2, each CA bus wire and DQ bus wire will have two loads (one from each LRDIMM). If the loading could be further reduced, the timing margins of the CA and DQ signals could likewise be increased, which, in turn, would provide higher memory channel frequencies and corresponding memory channel bandwidth (read/write operations could be performed in less time).

A next generation JEDEC SDRAM memory interface standard, referred to as SDRAM DDR5 (e.g., described in "DDR5 SDRAM", Doc. No. JESD79-5, July 2020, published by JEDEC), is taking the approach of physically splitting both the CA bus and the DQ bus into two separate multi-drop busses as depicted in FIG. 4a. Here, comparing FIG. 3b with FIG. 4a, note that whereas the layout of FIG. 3b depicts a single N bit wide CA bus that is multi-dropped to two DIMM slots 311_1, 311_2 and a single M bit wide DQ data bus that is also multi-dropped to the two DIMM slots 311_1, 311_2; by contrast, the DDR5 layout of FIG. 4a consists of two separate M/2 bit wide CA busses that are multi-dropped to two DIMM slots 411_1, 411_2 and two separate M/2 bit wide DQ data busses that are multi-dropped to the DIMM slots 411_1, 411_2. Both M/2 busses (or channels) together can be viewed as being part of a same memory interface (the memory interface being split into two separate M/2 data busses/channels).

Again, for simplicity, ECC bits are ignored and M=64 in both FIGS. 3b and 4a for DDR4 and DDR5 implementations, respectively. As such, whereas DDR4 has a single 64 bit wide data bus, by contrast, DDR5 has two 32 bit wide data busses (DQ_1 and DQ_2). A "rank" in a DDR5 system therefore corresponds to 32 bits and not 64 bits (the width of both the DQ_1 and DQ_2 data busses is M/2=64/2=32 bits). Likewise, a rank of memory chips for a DDR5 system accepts 32 bits of data from a sub-channel in a single transfer rather than 64 as in DDR4.

A concern, however, is that the JEDEC DDR5 layout of FIG. 4a still adopts a multi-drop bus approach. That is both pairs of CA and DQ busses, as observed in FIG. 4a, multi-drop to both DIMM slots 411_1, 411_2. With both the CA and DQ busses adopting a multi-drop approach, there is no fundamental increase in operating frequency of the channel nor corresponding increase in data rate of the DDR5 memory channel as compared to the earlier channel of FIG. 3b. That is, in terms of data rate, the physical layout of FIG.

4a will generally possess the same physical limitations as the earlier generation memory channel of FIG. 3b.

FIG. 4b therefore shows an improved memory channel approach that conforms to the DDR5 host side interface 430 (at least in terms of CA and DQ bus wire-count, pin-out and/or signaling) but in which the different DIMMs do not couple to the interface 430 in a multi-drop fashion. Instead, comparing FIG. 4a and FIG. 4b, the data bus of the memory channel in FIG. 4b is split into a pair of point-to-point (P2P) data busses DQ_1, DQ_2 that each connect a different DIMM to the host. With point-to-point links rather than multi-drop busses being incorporated into the improved layout of FIG. 4b, the layout of FIG. 4b should be able to exhibit faster operating frequencies and/or data rates than the nominal DDR5 approach of FIG. 4a.

FIG. 4c shows an improved DIMM 400, referred to as a multipleXing LRDIMM ("XLRDIMM"), that can be plugged into either of the slots 411_1, 411_2 of the improved memory channel design of FIG. 4a. If only half of the ranks depicted in the XLRDIMM of FIG. 4c are populated on the DIMM (the DIMM includes only ranks 0 and 1, or, only ranks 2 and 3), the resulting DIMM can plug into one of slots 421_1, 421_2 of the alternate improved memory channel design of FIG. 4b. Here, the XLRDIMM 400 of FIG. 4c is designed to multiplex 32 bit transfers over a same burst time window to two different ranks of memory chips over a same M/2 (32 bit) channel. That is, 32 bit transfers are multiplexed between ranks 0 and 1 over a first M/2 channel 401_1, and, 32 bit transfers are multiplexed between ranks 2 and 3 over a second M/2 channel 401_2.

FIG. 4d shows a high level view of the write timing. Inset 410 shows a write transfer as performed by the improved XLRDIMM 400 of FIG. 4c, while, inset 420 shows a write transfer for the prior art DDR4 LRDIMM 300 of FIG. 3a as a point of comparison. As observed at inset 420, the prior art DDR4 LRDIMM 300 receives eight transfers of 64 bits over eight cycles 0 through 7 to effect a total burst of 512 bits.

By contrast, referring to the improved XLRDIMM write process of inset 410, the transfer process over a single data bus (DQ_1) consists of two multiplexed data streams 408, 412 that target different ranks of memory chips of the XLRDIMM that are coupled to a same M/2 data bus. In particular, also referring to FIG. 4c, data stream 408 targets rank 0 and data stream 412 targets rank 1, where, both streams are multiplexed on the DQ_1 bus. A multiplexer 407_1 on the XLRDIMM 400 provides the multiplexing between these streams 408, 412 on the DQ_1 bus.

More specifically, during a first cycle (0) of the XLRDIMM data strobe (DQS) signal 413, a first 32 bit transfer on the DQ_1 bus targets rank 0 at base address A. During a second immediately following DQS cycle (1), a second 32 bit transfer on the DQ_1 bus targets rank 1 at base address B. During a third immediately following DQS cycle (3), a third 32 bit transfer on the DQ_1 bus targets rank 1 at incremented address A+1. During a fourth immediately following DQS cycle, a fourth 32 bit transfer on the DQ_1 bus targets rank 1 at incremented base address B+1.

The process continues until 512 bits have been transferred for both targeted ranks of memory chips which corresponds to 16 cycles for each of the targeted ranks of memory chips (32 bits per transfer×16 transfers=512 bits) which, in turn, corresponds to 32 total cycles of the DQS signal 413 because of the multiplexing activity. FIG. 4d therefore only shows half of a complete 512 transfer per targeted rank of memory chips (only eight cycles per targeted rank is depicted).

Note that the total amount of data transferred on the DQ_1 bus by the XLRDIMM process 420 over the depicted eight cycles (256 bits for each of streams 408 and 412=512 total bits) is the same as the total amount of data transferred by the prior art DDR4 process 410 (64 bits per transfer×8 transfers=512 bits). However, because there are two separate DQ data busses with an XLRDIMM interface 430 (DQ_1 and DQ_2), two additional ranks can be accessed simultaneously (ranks 0 and 1 on DQ_1 and ranks 2 and 3 on DQ_2) thereby doubling the bandwidth of the overall XLRDIMM memory interface 430 from the perspective of the host as compared to a DDR4 interface.

That is, when accounting for both DQ_1 and DQ_2, the XLRDIMM write process 420 transfers twice as much data as the prior art DDR4 process 410. Thus, the doubled speed of the XLRDIMM DQS signal 413 as compared to the prior art DDR4 DQS signal translates into a doubling of total data rate through the interface 430 from the perspective of the host. The higher frequency DQS signal 413 and associated data signals on the DQ_1 and DQ_2 busses with the XLRDIMM approach 410 may be achieved, for example, by plugging only one quad rank XLRDIMM 400 into either of slots 411_1, 411_2 in the layout scheme of FIG. 4a, or, plugging one dual rank XLRDIMM (that includes only half the ranks/channels of the XLRDIMM of FIG. 4a) into slot 421_1 and plugging another dual rank XLRDIMM into slot 421_2 in the layout scheme of FIG. 4b. In either arrangement, there is only one chip load per DQ pin which permits higher frequency signals to exist on the DQ busses (DQ_1, DQ_2).

Importantly, the speed/frequency of the memory chips on the XLRDIMM 400 need not double. Here, the multiplexing activity performed by the XLRDIMM on a same DQ bus effects transfer to each of the targeted ranks of memory chips once per DQS cycle. As such, with only one transfer per DQS cycle, both the ranks of targeted memory chips operate at approximately the same frequency/speed as the memory chips of the prior art LRDIMM 300 of FIG. 3a.

The XLRDIMM approach also transfers the combined data targeted for both ranks of memory chips according to a double data rate technique on the DQ_1 and DQ_2 busses (both rising and falling edges of the DQS signal 413 corresponds to DQS cycles). The multiplexing activity on the XLRDIMM, however, causes the memory chips themselves to be accessed according to a double data rate technique with a clock having a frequency that is one half the frequency of the DQS signal 413 (each memory chip experiences a data transfer on the rising and falling edge of a clock resembling slower clock 414). These clocks are represented by the DQS/2_Φ1 and DQS/2_Φ2 signals in FIG. 4d.

The DQS/2_Φ1 and DQS/2_Φ2 signals indicate that the different targeted ranks of memory chips that are multiplexed over a same burst window can be accessed at different time with respect to one another. For example, on the DQ_1 bus, the memory chips from rank 0 are accessed at a first clock phase and the rank of memory chips from rank 1 are accessed at a second (e.g., lagging) clock phase. In such embodiments, ranks of data emerge from the buffering logic circuitry 406_1 in the sequence order in which they are received from the data bus (in the case of a write). The multiplexer 407_1 then steers the data to the correct target rank of memory chips. Here, the register and redrive circuitry 405_1 may craft the correct channel select input to the multiplexer 407_1 and memory chip access signals to the correct rank of memory chips to effect the correct multiplexing activity.

Other approaches may choose to access the different targeted ranks of memory chips that are multiplexed over a same burst window in phase with one another (at the same time). For example, according to approach, the buffering logic circuitry 406_1 may, e.g., impose a store-and-forward approach to one of the targeted rank's data streams to eliminate the phase difference that exists between the respective data streams of the pair of targeted ranks on the data bus. For example, referring to FIG. 4*d*, the data of rank 0 (represented by stream 408) may be delayed by the buffer circuitry 406_1 for one cycle of the DQS signal 413 which, in turn, temporarily aligns the data with the data that is targeted to rank 1 (represent by stream 412). Data from both streams can then be simultaneously written into ranks 0 and 1 on the DIMM 400.

Note that this approach may obviate the existence of any actual multiplexing circuitry 406_1. That is, the multiplexing activity of the XLRDIMM is logically (rather than actually) effected with the store and forwarding performed by the buffer circuitry 406_1. As such, multiplexing circuitry should be understood to include not only actual multiplexing circuitry (such as multiplexer 407_1) but also circuitry designed to eliminate phase differences in data through store-and-forwarding (which may be performed by buffer circuitry 406_1). Other embodiments may include both actual multiplexing circuitry and store-and-forwarding circuitry. In embodiments that do use actual multiplexing circuitry, such actual multiplexing circuitry may be physically integrated into the buffer semiconductor chips used to implement buffer circuitry 406_1. Note that the above discussion has focused on the DQ_1 bus (buffer 406_1, multiplexer 407_1, and ranks 0 and 1). However, the same operations and commentary apply to the circuitry that is associated with the DQ_2 bus irrespective of whether such circuitry resides on the same DIMM with DQ_1 circuitry as depicted in FIG. 4*c* (buffer 406_2, multiplexer 407_2, and ranks 2 and 3), or, resides on another DIMM (where one dual rank DIMM is associated with DQ_1 and another dual rank DIMM is associated with DQ_2).

To reiterate, in actual DDR5 implementations, the rank size is 32 bits which corresponds to the amount of data that is transferred on the data bus per DQS cycle. However, the size of the data bus is larger than that to accommodate the ECC bits (e.g., 32 bits data plus 8 bits ECC=40 total data bus bits). The ranks of memory chips are likewise designed with a data width to accommodate both data and ECC (e.g., 40 bits wide).

Although the above description has been directed to a write process, a read process on DQ_1 can transpire by reading data from ranks 0 and 1 consistent with the techniques described above. As with writes, ranks 0 and 1 may be accessed out-of-phase with one another (e.g., with actual multiplexing circuitry and no store-and-forwarding in the read direction in the buffer circuitry or simultaneously with one another (e.g., with store-and-forwarding in the read direction in the buffer circuitry).

FIGS. 4*e* and 4*f* pertain to another XLRDIMM embodiment in which the DIMM multiplexes data streams between four different ranks on a single M/2 (32 bit) data bus DQ_1. Here, as a point of comparison with the XLRDIMM embodiment of FIGS. 4*c* and 4*d*, the XLRDIMM of FIGS. 4*e* and 4*f* has a DQS signal frequency that is twice that of the XLRDIMM of FIGS. 4*c* and 4*d*. As such, rather than multiplexing data transfers between two ranks, instead, data transfers are multiplexed between four ranks.

FIG. 4*f* shows a timing diagram of write. Each DQS signal edge corresponds to a transfer of one of ranks 0 through 3, where, each next edge corresponds to a transfer of a next, different one of these ranks such that rank selection "rotates" or is distributed across ranks 0 through 3 in a round robin fashion with each DQS signal edge. With respect to the DQS signal frequency that is applied to the memory chips themselves, because each rank is accessed on only every four DQS signals, the memory chips can be accessed at $\frac{1}{4}^{th}$ the frequency of the DQS signal.

In the case where the DIMM is designed to interface to both the DQ_1 and DQ_2 data busses, the DIMM includes eight ranks as observed in FIG. 4*e*. Other embodiments can include only four ranks that interface to only one of the DQ_1 and DQ_2 data busses. As with the XLRDIMM embodiment of FIGS. 4*c* and 4*d*, the multiplexer circuitry 417_1, 417_2 may physically exist with four different memory access phases applied to the memory chips per DQ bus, or, the multiplexing activity may be effected by store and forwarding and/or multiplexing within the buffer circuits 16_1, 416_2 such that separate multiplexers 417 outside the buffers 416 are not present. Reads are implemented by performing the opposite of a write.

FIGS. 4*g* and 4*h* show another embodiment in which a single M/2 DQ bus (e.g., DQ_1) is partitioned into two separate M/4 sub-buses DQ_1_1, DQ_1_2 (e.g., a first 16 bit data bus plus 4 bits ECC and second 16 bit data bus plus 4 bits ECC). A first of the M/4 buses multiplexes data transfers between first and second ranks (rank 0 and rank 1 for DQ_1_1) and a second of the M/4 buses multiplexes data transfers between third and fourth ranks (rank 2 and rank 3 for DQ_1_2). As observed in FIGS. 4*g* and 4*h*, in various embodiments, each of the ranks are accessed at full width (M/2) and the transfers are effected over the corresponding M/4 bus by "double-pumping" between the buffer and the physical M/4 DQ bus. That is, for every access applied to a memory chip, two accesses are applied at the register/sub-channel interface. As such, as observed in the timing diagram of FIG. 4*h*, transfers to/from a particular rank are performed on consecutive DQS edges and selected ranks are alternated over alternating DQS periods/pulses (as opposed to half-periods/edges).

Here, the double-pumping can be set-up for the M/4 DQ bus by, for example, in the case of a read, reading a full M/2 (e.g., 32 bits for DDR5) width of data from a rank and then selecting a first half of the full width of data for transmission over the sub-channel and then selecting the other half of the full width of data for transmission over the sub-channel. Which halves are selected for first and second transmission over the sub-channel can vary from embodiment to embodiment (e.g., "top half" and "bottom half", "even numbered bits" and "odd numbered bits", etc.).

In still other approaches, rather than simultaneously read a full M/2 from the rank, I/Os of memory chips in a same rank are tied to a same wire and the double pumping activity is effected at the memory chips themselves by accessing different halves of chips in different phases. For example, for M/2=32 and X4 memory chips, in order to implement a "top half/bottom half" double pumping approach, bit 0 (which corresponds to bit 0 of memory chip 0) and bit 16 (which corresponds to bit 0 of memory chip 4) are tied to the same DQ wire between the rank and the buffer. Bits 1 through 15 are then individually and respectively coupled to bits 17 through 31 in this same fashion which results in only 16 DQ wires between the rank and the buffer. The double pumping is then achieved by reading from memory chips 0 through 3 at different phase than memory chips 4 through 7. The reverse is applied in the case of a write.

Because of the double-pumping (or 2:1 ratio) between physical sub-bus and memory rank accesses and the multiplexing between two different ranks, individual memory ranks are accessed at ¼$^{th}$ the frequency of the DQS signal. Again, multiplexing may be effected by actual multiplexer circuitry that resides outside the buffers 446 with corresponding accesses of different ranks at different phases. Alternatively, memory ranks can be simultaneously accessed and store-and-forwarding and/or multiplexing is performed within the buffers so that separate multiplexer 447 need not be present.

Note that the circuitry shows in the DIMM embodiment 403 of FIG. 4g only sources/feeds a single M/2 (32 bit) data channel. As such, the circuitry observed in FIG. 4g may be doubled on a same DIMM to produce a DIMM that transfers data over both M/2 buses (DQ_1 and DQ_2).

FIG. 5a shows an exemplary memory controller 501 that is capable of driving a memory channel as described above having the XLRDIMM 400 of FIG. 4c plugged into either of its DQ_1 and DQ_2 data busses (or having a first half DIMMs plugged into one of the DQ_1 and DQ_2 data busses and a second half DIMM plugged into the other one of the DQ_1 and DQ_2 data busses). The memory controller comprises first and second memory interfaces 504_1, 504_2 that each comprise the I/Os for a pair of M/2 DQ data buses. Each interface therefore includes first and second groups of input/outputs (I/Os) to respective couple to first and second M/2 DQ buses.

As observed in FIG. 5a the memory controller receives memory read and memory write requests at input node 502. Scheduler and address mapping circuitry 503 orders and directs the requests to an appropriate memory channel interface (e.g., interface 504_1 or 504_2). Notably, each memory channel interface includes its own address mapping logic circuitry (not shown in FIG. 5a for illustrative ease) to map each request to the correct one of DQ_1 and DQ_2. That is, with two separate M/2 DQ buses, the memory interface circuitry 504_1 itself has to map the addresses of the requests it receives to a particular one of its M/2 DQ buses.

Here, an inbound queue 505_1, 505_2 precedes each interface 504_1, 504_2 and the address mapping circuitry of an interface may pull requests out-of-order from the queue to keep any/all DIMMs that are coupled to the interface busy (e.g., if the front of the queue contains requests that map to only one of the DQ busses, the address mapping logic may pull a request from deeper back in the queue that maps to the other DQ bus). Such pulling of requests may further take into account the multiplexing activity on any particular DQ bus. For instance, as described with respect to the XLRDIMM implementation of FIG. 4c, the XLRDIMM 400 is constructed to concurrently multiplex between two different ranks of memory chips on a particular M/2 DQ bus.

Here, certain higher order bits of a request's address may map to one or the other of these ranks. In order to keep a particular one of the M/2 DQ busses at maximum capacity when possible, the interface's address mapping logic circuitry may service requests out-of-order from the interface's queue so that requests whose addresses map to different ranks of a same M/2 DQ bus can be serviced concurrently and multiplexed on the XLRDIMM's particular DQ bus.

Likewise, the memory interface circuitry 504_1 includes a pair of multiplexer circuits 506_1 and 506_2, one for each DQ bus (DQ_1 and DQ_2), to multiplex data from two different ranks to/from a same DQ bus during a same burst transfer process as described above. As described above, both multiplexers 506_1, 506_2 may concurrently operate to concurrently transfer the data of four data ranks between the interface 504_1 and the pair of M/2 DQ busses it is coupled to during a same burst transfer sequence. Multiplexing may be done actually or logically (e.g., with store-and-forward circuitry).

Each memory interface 504_1, 504_2 also includes signal generation logic circuitry to generate the appropriate CA and DQ signals for each DIMM consistent with the teachings above. The memory controller 501 may include configuration register space (not depicted in FIG. 5a for illustrative ease) whose corresponding information is used to configure each memory interface. In an embodiment, the register space is used to define whether the memory interfaces are to operate in an XLRDIMM mode as described above, or, operate according to a DDR5 mode. If the later is specified, the multiplexing activity of the memory controller is disabled and data for only a single rank of memory chips is propagated on any DQ_1 or DQ_2 bus during a burst transfer.

FIG. 5b shows an embodiment of a memory controller that is designed to communicate with the XLRDIMM embodiment of FIG. 4e. For simplicity, circuitry that feeds only one of an interface's DQ busses is depicted per interface. Here, the memory controller operates as described above in FIG. 5a except that the memory controller is designed to multiplex between four different ranks per M/2 DQ bus.

FIG. 5c shows a memory controller that is designed to operate with the XLRDIMM of FIG. 4g. The memory controller operates as described above with respect to FIG. 5a except that the memory controller recognizes that each M/2 DQ bus is partitioned into M/4 sub-busses and can further multiplex data transfers between two ranks on any particular M/4 sub-bus.

Although discussions above has been directed to a particular DDR5 implementation specifying, e.g., number of cycles per burst transaction, number of DIMM slots per interface, 2:1 multiplexing ratio, memory chip clock being half the channel clock, etc., it is pertinent to recognize that other embodiments may exist having different numbers for these and other features than those described above. For example, a DIMM that architecturally groups ranks in groups of four may use a 4:1 multiplexing ratio and its memory chips that receive a DQS/4 clock. Embodiments also exist having values of M other than 64 or rank sizes other than 32.

FIG. 6 provides an exemplary depiction of a computing system 600 (e.g., a smartphone, a tablet computer, a laptop computer, a desktop computer, a server computer, etc.). As observed in FIG. 6, the basic computing system 600 may include a central processing unit 601 (which may include, e.g., a plurality of general purpose processing cores 615_1 through 615_X) and a main memory controller 617 disposed on a multi-core processor or applications processor, system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_Y, one or more cameras 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing unit 616 typically executes graphics intensive functions to, e.g., generate graphics information that is presented on the display 603. The memory control function 617 interfaces with the system memory 602 to write/read data to/from system memory 602. The power management control unit 612 generally controls the power consumption of the system 600.

Each of the touchscreen display 603, the communication interfaces 604-507, the GPS interface 608, the sensors 609, the camera(s) 610, and the speaker/microphone codec 613, 614 all can be viewed as various forms of I/O (input and/or output) relative to the overall computing system including, where appropriate, an integrated peripheral device as well (e.g., the one or more cameras 610). Depending on implementation, various ones of these I/O components may be integrated on the applications processor/multi-core processor 650 or may be located off the die or outside the package of the applications processor/multi-core processor 650. The computing system also includes non-volatile storage 620 which may be the mass storage component of the system.

The main memory control function 617 (e.g., main memory controller, system memory controller) may be designed consistent with the teachings above describing a host side memory interface that is able to multiplex data directed to/from different ranks of memory chips through a same host side memory interface during a same burst transfer to/from, e.g., an XLRDIMMs as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

An apparatus has been described. The apparatus includes logic circuitry to multiplex on a data bus a first data burst, a second data burst, a third data burst and a fourth data burst having different respective base target addresses that respectively target a first memory rank, a second memory rank, a third memory rank and a fourth memory rank. The first data transfer for the first data burst occurs on a first edge of a first pulse of a data strobe signal for the data bus and a second data transfer for the second data burst occurs on a second edge of the first pulse of the data strobe signal. A third data transfer for the third data burst occurs on a first edge of a second pulse of the data strobe signal for the data bus and a fourth data transfer for the fourth data burst occurs on a second edge of the second pulse. The second pulse immediately follows the first pulse on the data strobe signal. The first memory rank, the second memory rank, the third memory rank and the fourth memory rank are on a same memory module.

Another apparatus has been described. The apparatus includes logic circuitry to multiplex on a data bus a first data burst, a second data burst, a third data burst and a fourth data burst having different respective base target addresses that respectively target a first memory rank, a second memory rank, a third memory rank and a fourth memory rank. The first data transfer for the first data burst occurs on a first edge of a first pulse of a data strobe signal for the data bus and a second data transfer for the first data burst occurs on a second edge of the first pulse of the data strobe signal. A third data transfer for the second data burst occurs on a first edge of a second pulse of the data strobe signal and a fourth data transfer for the second data burst occurs on a second edge of the second pulse of the data strobe signal. The second pulse immediately follows the first pulse on the data strobe signal. The first memory rank, the second memory rank, the third memory rank and the fourth memory rank are on a same memory module.

The first, second, third and fourth data transfers can be 32 bits each. The first, second, third and fourth bursts can be sixteen data transfers each. Respective data strobe signals received by respective memory devices of the first, second, third and fourth memory ranks can have a first frequency that is $\frac{1}{4}^{th}$ a second frequency of the data strobe signal. The data bus can conform to an industry standard specification. The industry standard specification can be a JEDEC DDR5 industry standard specification. The logic circuitry can be integrated into a memory controller. The logic circuitry can be integrated on the memory module.

A computing system has been described. The computing system includes a plurality of processing cores; a network interface; a memory controller coupled to the plurality of processing cores; a data bus coupled to the memory controller and a memory module coupled to the data bus. The memory module can include either of a) and b) below: a) logic circuitry to multiplex on a data bus a first data burst, a second data burst, a third data burst and a fourth data burst having different respective base target addresses that respectively target a first memory rank, a second memory rank, a third memory rank and a fourth memory rank, wherein, a first data transfer for the first data burst occurs on a first edge of a first pulse of a data strobe signal for the data bus and a second data transfer for the second data burst occurs on a second edge of the first pulse of the data strobe signal, and wherein, a third data transfer for the third data burst occurs on a first edge of a second pulse of the data strobe signal for the data bus and a fourth data transfer for the fourth data burst occurs on a second edge of the second pulse, wherein the second pulse immediately follows the first pulse on the data strobe signal; b) logic circuitry to multiplex on a data bus a first data burst, a second data burst, a third data burst and a fourth data burst having different respective base target addresses that respectively target a first memory rank, a second memory rank, a third memory rank and a fourth memory rank, wherein, a first data transfer for the first data burst occurs on a first edge of a first pulse of a data strobe signal for the data bus and a second data transfer for the first data burst occurs on a second edge of the first pulse of the data strobe signal, and wherein, a third data transfer for the second data burst occurs on a first edge of a second pulse of the data strobe signal and a fourth data transfer for the second data burst occurs on a second edge of the second pulse of the data strobe signal, wherein the second pulse immediately follows the first pulse on the data strobe signal.

The first, second, third and fourth data transfers can be 32 bits each. The first, second, third and fourth bursts can be sixteen data transfers each. Respective data strobe signals received by respective memory devices of the first, second, third and fourth memory ranks can have a first frequency that is $\frac{1}{4}^{th}$ a second frequency of the data strobe signal. The data bus can conform to an industry standard specification. The industry standard specification can be a JEDEC DDR5 industry standard specification.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed:

1. An apparatus, comprising:
   logic circuitry to multiplex on a data bus a first data burst, a second data burst, a third data burst and a fourth data burst having different respective base target addresses that respectively target a first memory rank, a second memory rank, a third memory rank and a fourth memory rank, wherein, a first data transfer for the first data burst occurs on a first edge of a first pulse of a data strobe signal for the data bus and a second data transfer for the second data burst occurs on a second edge of the first pulse of the data strobe signal, and wherein, a third data transfer for the third data burst occurs on a first edge of a second pulse of the data strobe signal for the data bus and a fourth data transfer for the fourth data burst occurs on a second edge of the second pulse, wherein the second pulse immediately follows the first pulse on the data strobe signal, and wherein, the first memory rank, the second memory rank, the third memory rank and the fourth memory rank are on a same memory module.

2. The apparatus of claim 1 wherein the first, second, third and fourth data transfers are 32 bits each.

3. The apparatus of claim 1 wherein respective data strobe signals received by respective memory devices of the first, second, third and fourth memory ranks have a first frequency that is $\frac{1}{4}^{th}$ a second frequency of the data strobe signal.

4. The apparatus of claim 1 wherein the data bus conforms to an industry standard specification.

5. The apparatus of claim 4 wherein the industry standard specification is a Joint Electron Device Engineering Council (JEDEC) Dual Data Rate 5 (DDR5) industry standard specification.

6. The apparatus of claim 1 wherein the logic circuitry is integrated into a memory controller.

7. The apparatus of claim 1 wherein the logic circuitry is integrated on the memory module.

8. An apparatus, comprising:
   logic circuitry to multiplex on a data bus a first data burst, a second data burst, a third data burst and a fourth data burst having different respective base target addresses that respectively target a first memory rank, a second memory rank, a third memory rank and a fourth memory rank, wherein, a first data transfer for the first data burst occurs on a first edge of a first pulse of a data strobe signal for the data bus and a second data transfer for the first data burst occurs on a second edge of the first pulse of the data strobe signal, and wherein, a third data transfer for the second data burst occurs on a first edge of a second pulse of the data strobe signal and a fourth data transfer for the second data burst occurs on a second edge of the second pulse of the data strobe signal, wherein the second pulse immediately follows the first pulse on the data strobe signal, and wherein, the first memory rank, the second memory rank, the third memory rank and the fourth memory rank are on a same memory module.

9. The apparatus of claim 8 wherein the first, second, third and fourth data transfers are 32 bits each.

10. The apparatus of claim 8 wherein respective data strobe signals received by respective memory devices of the first, second, third and fourth memory ranks have a first frequency that is $\frac{1}{4}^{th}$ a second frequency of the data strobe signal.

11. The apparatus of claim 8 wherein the data bus conforms to an industry standard specification.

12. The apparatus of claim 11 wherein the industry standard specification is a Joint Electron Device Engineering Council (JEDEC) Synchronous Dynamic Random Access (SDRAM) Dual Data Rate 5 (DDR5) industry standard specification.

13. The apparatus of claim 8 wherein the logic circuitry is integrated into a memory controller.

14. The apparatus of claim 8 wherein the logic circuitry is integrated on a memory module.

15. A computing system, comprising:
   a plurality of processing cores;
   a network interface;
   a memory controller coupled to the plurality of processing cores;
   a data bus coupled to the memory controller;
   a memory module coupled to the data bus, the memory module comprising either of a) and b) below:
   a) first logic circuitry to multiplex on a data bus a first data burst, a second data burst, a third data burst and a fourth data burst having different respective base target addresses that respectively target a first memory rank, a second memory rank, a third memory rank and a fourth memory rank, wherein, a first data transfer for the first data burst occurs on a first edge of a first pulse of a data strobe signal for the data bus and a second data transfer for the second data burst occurs on a second edge of the first pulse of the data strobe signal, and wherein, a third data transfer for the third data burst occurs on a first edge of a second pulse of the data strobe signal for the data bus and a fourth data transfer for the fourth data burst occurs on a second edge of the second pulse, wherein the second pulse immediately follows the first pulse on the data strobe signal; and,
   b) second logic circuitry to multiplex on a data bus a first data burst, a second data burst, a third data burst and a fourth data burst having different respective base target addresses that respectively target a first memory rank, a second memory rank, a third memory rank and a fourth memory rank, wherein, a first data transfer for the first data burst occurs on a first edge of a first pulse of a data strobe signal for the data bus and a second data transfer for the first data burst occurs on a second edge of the first pulse of the data strobe signal, and wherein, a third data transfer for the second data burst occurs on a first edge of a second pulse of the data strobe signal and a fourth data transfer for the second data burst occurs on a second edge of the second pulse of the data strobe signal, wherein the second pulse immediately follows the first pulse on the data strobe signal.

16. The computing system of claim 15 wherein the first and second data transfers are 32 bits each.

17. The computing system of claim 16 wherein the first and second data bursts are sixteen data transfers each.

18. The computing system of claim 15 wherein respective data strobe signals received by respective memory devices of the first and second memory ranks have a first frequency that is $\frac{1}{4}^{th}$ a second frequency of the data strobe signal.

19. The computing system of claim 15 wherein the data bus conforms to an industry standard specification.

20. The computing system of claim 19 wherein the industry standard specification is a Joint Electron Device Engineering Council (JEDEC) Synchronous Dynamic Random Access (SDRAM) Dual Data Rate 5 (DDR5) industry standard specification.

* * * * *